(12) United States Patent
Choi

(10) Patent No.: US 8,878,319 B2
(45) Date of Patent: Nov. 4, 2014

(54) MAGNETIC TUNNEL JUNCTION DEVICE AND METHOD FOR FABRICATING THE SAME

(75) Inventor: Won Joon Choi, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 217 days.

(21) Appl. No.: 13/336,524

(22) Filed: Dec. 23, 2011

(65) Prior Publication Data

US 2013/0015540 A1 Jan. 17, 2013

(30) Foreign Application Priority Data

Jul. 13, 2011 (KR) .................. 10-2011-0069464

(51) Int. Cl.
| | |
|---|---|
| *H01L 29/82* | (2006.01) |
| *H01L 43/02* | (2006.01) |
| *H01L 43/12* | (2006.01) |
| *H01L 43/08* | (2006.01) |

(52) U.S. Cl.
CPC ............... *H01L 43/02* (2013.01); *H01L 43/12* (2013.01); *H01L 43/08* (2013.01)
USPC .............................. 257/421; 257/108; 438/3

(58) Field of Classification Search
CPC ....... H01L 27/222; H01L 43/08; H01L 29/82; H01L 29/86; H01L 45/1253; H01L 45/04; H01L 27/108; H01L 27/11
USPC ............. 257/421, 108, 414; 438/3, 48, 49, 54
See application file for complete search history.

(56) References Cited

U.S. PATENT DOCUMENTS

| | | | |
|---|---|---|---|
| 2004/0188733 A1* | 9/2004 | Asao et al. ..................... | 257/295 |
| 2011/0037108 A1* | 2/2011 | Sugiura et al. ................ | 257/295 |

* cited by examiner

*Primary Examiner* — Thanh Y Tran
(74) *Attorney, Agent, or Firm* — IP & T Group LLP

(57) ABSTRACT

A magnetic tunnel junction device includes a first electrode having a curved top surface, a magnetic tunnel junction layer formed along the top surface of the first electrode, and a second electrode formed on the magnetic tunnel junction layer.

7 Claims, 8 Drawing Sheets

MAGNETIC TUNNEL JUNCTION DEVICE AND METHOD FOR FABRICATING THE SAME

CROSS-REFERENCE(S) TO RELATED APPLICATIONS

The present application claims priority of Korean Patent Application No. 10-2011-0069464, filed on Jul. 13, 2011, which is incorporated herein by reference in its entirety.

BACKGROUND OF THE INVENTION

The present invention relates to a semiconductor memory device and a manufacturing method thereof, and more particularly to a magnetic tunnel junction device using a magnetic tunnel junction layer and a fabricating method thereof.

As semiconductor memory technologies have been developed for highly integrated memory, a Magnetic Random Access Memory (MRAM) would become widely used among all types of memories because the MRAM has advantages on integration, operating speed, non-volatility. The MRAM includes a transistor configured to perform a switching function and a Magnetic Tunnel Junction (MTJ) device configured to store information. The MTJ device includes a magnetic tunnel junction layer and electrodes formed the top and bottom portions of the magnetic tunnel junction layer, wherein the magnetic tunnel junction layer includes two ferromagnetic layers and a tunnel barrier layer arranged therebetween. The magnetic tunnel junction layer has different Magneto-resistance (MR) depending on magnetization directions of the two ferromagnetic layers. Using the variation in voltage or current caused by the variation of the MR, it may be determined whether information stored in the MTJ indicates a logic level of "0" or "1".

The MTJ device has a thin insulating layer between two magnetic layers. One of the magnetic layers, i.e., a free layer, has a free state where magnetization direction is easily changed when current flows. The other, i.e., a pinned layer, has magnetization direction set to a particular polarity. If the two magnetic layers have the same magnetization direction, resistance becomes low so that electrons can easily pass through them. This is a case that the stored data is recognized as a logic high level "1". Otherwise, if the two magnetic layers have the opposite magnetization directions, resistance becomes high so that electrons hardly pass through them. This is a case that the stored data is recognized as a logic low level "0".

In conventional MRAM, there may be a disadvantage in scalability because an additional digit line may be required to write data into the MTJ device. Further, magnetization process to a particular cell may affect to magnetization directions of nearby cells. Thus, it may be hard to manufacture products.

Spin-transfer torque (STT) technology makes MRAM modify above-mentioned features. A Spin-transfer torque Random Access Memory (STT-RAM) is so called as a Spin-transfer torque Magnetic Random Access Memory (STT-MRAM) in an advanced form of MRAM. At very small device scales, a spin-polarized current may transfer its spin angular momentum to a small magnetic element in the spin-transfer torque random access memory (STT-RAM). When a high density current passes through a ferromagnetic layer, if a magnetization direction of the ferromagnetic layer is different from spin-polarity of current, its magnetization direction may be forcibly adjusted to have the same polarity with electrons. Accordingly, if high density current flows from the pinned layer to the free layer, two layers have the same polarity. This is a case that the stored information is a logic high level "1". Otherwise, when current flows from the free layer to the pinned layer, spin accumulation occurs at boundaries of a thin insulating layer so that two layers have the opposite polarities. This is a case that the stored information is a logic low level "0".

As the STT technology applies to MRAM, write operation may be performed without the additional digit line, and interference between nearby cells may be alleviated. The STT-RAM has the advantages of lower power consumption and better scalability over conventional MRAM. The STT-RAM is non-volatile memory device such as a flash memory device because the magnetic direction or polarity remains in the STT-RAM even if power supply is cut off. In addition, the STT-RAM has a faster operating speed than the conventional SRAM or DRAM.

The STT-RAM includes the MTJ device configured to store information. The STT-RAM reads or writes the information based on magnetization directions or polarities of stacked layers in the MTJ device. However, if the MTJ device has a smaller size to increase operating speed and density of the STT-RAM, ferromagnetic layers included in the MTJ device have smaller area so as to have super paramagnetic characteristic. In this case, the MTJ device may not be used as an information storage element.

Further, as the conventional STT-RAM including the MTJ device of a stacked layer is scaled down, it may be difficult to control magnetization direction of the stacked layer so that it is more likely to malfunction. Thus, it may be hard to increase a chip yield to a desired level. As a result, there may be a limit to make the MTJ small because ferromagnetic layers may have a secured area to prevent an occurrence of malfunction.

SUMMARY OF THE INVENTION

Exemplary embodiments of the present invention are directed to a magneto-resistive random access memory (MRAM) device having a high scalability or density.

In accordance with an exemplary embodiment of the present invention, a magnetic tunnel junction device includes a first electrode having a curved top surface, a magnetic tunnel junction layer formed along the top surface of the first electrode, and a second electrode formed on the magnetic tunnel junction layer.

In accordance with another exemplary embodiment of the present invention, a magnetic tunnel junction device includes a first electrode having a spherical structure with a protruded pillar pattern, a magnetic tunnel junction layer formed along a spherical surface of the first electrode, an insulating layer configured to insulate the magnetic tunnel junction layer from the protruded pillar pattern of the first electrode, and a second electrode formed on the magnetic tunnel junction layer.

In accordance with another exemplary embodiment of the present invention, a magnetic tunnel junction device includes a first electrode having a pillar structure, a magnetic tunnel junction layer including a bottom connected to the first electrode and a top curved surface, and a second electrode formed on the magnetic tunnel junction.

In accordance with another exemplary embodiment of the present invention, a magnetic tunnel junction device includes a first electrode having a pillar structure, a magnetic tunnel junction layer having a spherical surface and covering an upper part of the first electrode, a second electrode formed on the magnetic tunnel junction layer, and an insulating layer configured to electronically isolate the magnetic tunnel junction layer from a side area of the upper part of the first electrode.

In accordance with another exemplary embodiment of the present invention, a method for fabricating a magnetic tunnel junction device includes forming a first electrode having a curved top surface, forming a magnetic tunnel junction layer along the top surface of the first electrode, and forming a second electrode on the magnetic tunnel junction layer.

DESCRIPTION OF SPECIFIC EMBODIMENTS

Figure 1:
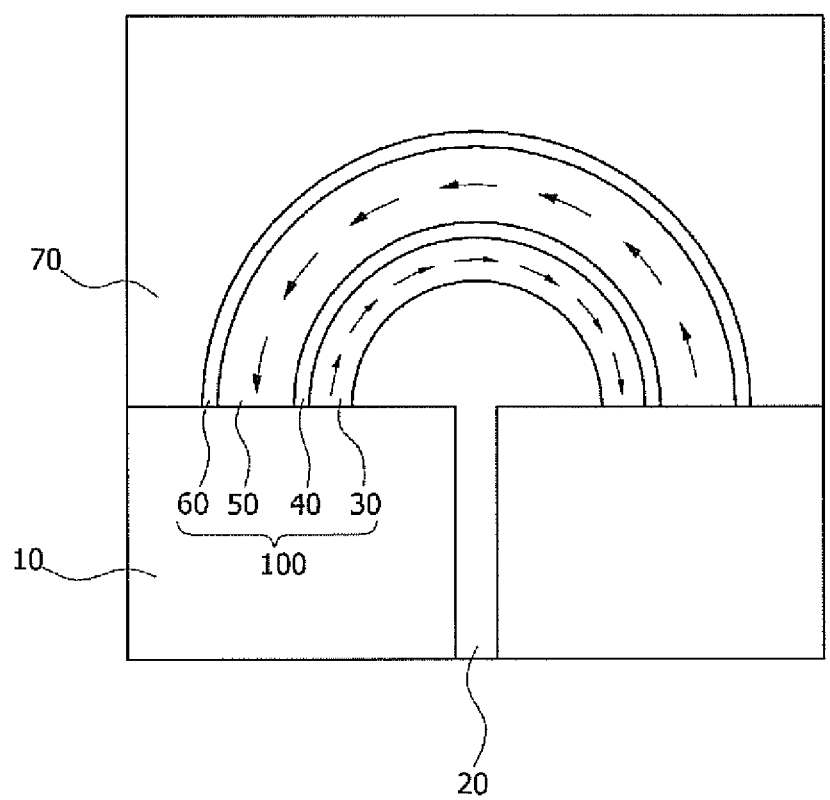
FIG. 1 is a cross-sectional view showing a magnetic tunnel junction (MTJ) device in accordance with an exemplary embodiment of the present invention.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a cross-sectional view showing a magnetic tunnel junction (MTJ) device in accordance with an exemplary embodiment of the present invention.

As shown, the MTJ device includes a first electrode 20, a magnetic tunnel junction layer 100 arranged/placed on the first electrode 20, and a second electrode 70 arranged on the magnetic tunnel junction 100. Here, a top surface of the first electrode 20 is curved or bowed, i.e., in a convex shape.

The first electrode 20 includes a first part (lower part) having a pillar shape and a second part (upper part) having a curved top surface. An insulating layer 10 surrounds the first part of the first electrode 20. The second part of the first electrode 20 is formed in a dome shape. The second electrode 70 has a flat top surface because the top surface is planarized.

Another insulating layer (not shown) may be further included to electrically isolate the MTJ device from other nearby MTJ devices. The insulating layer includes one selected from the group of an oxide layer, a nitride layer, an oxynitride layer, a carbonic layer, and a stacked layer of combining two or more of those. As the oxide layer, a silicon oxide such as $SiO_2$, a boron phosphorus silicate glass (BPSG), a phosphorus silicate glass (PSG), a tetra ethyle ortho silicate (TEOS), an un-doped silicate glass (USG), a spin-on-glass (SOG), a high density plasma (HDP) oxide, or a spin-on-dielectric (SOD) may be used. Also, as the nitride layer, a silicon nitride such as $Si_3N_4$ may be used. The oxynitride layer may include a SiON. The carbonic layer may include an amorphous carbon, a carbon rich polymer, a SiOC, or a SOC.

The first electrode 20 and the second electrode 70 may include a metal or a metal compound. As the metal, a titanium (Ti), a tantalum (Ta), a platinum (Pt), a copper (Cu), a tungsten (W), or an aluminum (Al) may be used. The metal compound may include a titanium nitride (TiN), a tantalum nitride (TaN), or a tungsten silicide (WSi). According to exemplary embodiments, the first electrode 20 and the second electrode 70 are formed of the same material or different materials.

The magnetic tunnel junction layer 100 includes a free layer 30 arranged on the first electrode 20, a tunnel insulating layer 40 arranged on the free layer 30, a pinned layer 50 arranged on the tunnel insulating layer 40, and a pinning layer 60 arranged on the pinned layer 50.

Further, in another exemplary embodiment, the magnetic tunnel junction layer 100 may have a stacked structure of a pinning layer, a pinned layer, a tunnel insulating layer, and a free layer, which are formed in order on the first electrode 20.

The pinning layer 60 serving as fixing the magnetization direction of the pinned layer 50 may include anti-ferromagnetic material. As the anti-ferromagnetic material, materials marked by chemical formulae of IrMn, PtMn, MnO, MnS, MnTe, $MnF_2$, $FeF_2$, $FeCl_2$, FeO, $CoCl_2$, CoO, $NiCl_2$, and NiO may be used. The pining layer 60 may include not only a single anti-ferromagnetic layer but two or more stacked anti-ferromagnetic layers.

The pinned layer 50 is set to a particular polarity, but the free layer 30 has a changeable polarity. An external stimulus such as a magnetic field or a spin transfer torque (STT) adjusts magnetization direction of the free layer 30. The free layer 30 and the pinned layer 50 include ferromagnetic materials. As the ferromagnetic materials, materials marked by chemical formulae of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$ may be used. The pinned layer 50 and the free layer 30 may include not only a single ferromagnetic layer but two or more stacked ferromagnetic layers. Further, the free layer 30 and the pinned layer 50 include a stacked structure of any ferromagnetic layer and a ruthenium (Ru) layer.

In another exemplary embodiment, the pinned layer 50 and the free layer 30 include a synthetic anti-ferromagnetic (SAF) layer which has a sequentially stacked structure of a ferromagnetic layer, anti-ferromagnetic coupling spacer layer, and another ferromagnetic layer.

The tunnel insulating layer 40 is used as a tunneling barrier between the pinned layer 50 and the free layer 30. The tunnel insulating layer 40 may include a magnesium oxide (MgO), an aluminum oxide ($Al_2O_3$), a magnesium aluminum oxide (MgAlO), a silicon nitride ($Si_3N_4$), a silicon oxynitride (SION), a silicon oxide (SiO2), a hafnium oxide ($HfO_2$), or a zirconium oxide ($ZrO_2$). In addition to these materials, any materials having insulation characteristic may be used for the tunnel insulating layer 40. For example, any insulating compound might be used even though it includes aluminum or any material having magnetic properties.

In an exemplary embodiment, the magnetic tunnel junction layer 100 may include sequentially stacked layers of an anti-ferromagnetic layer, a first ferromagnetic layer, a tunnel insulating layer, and a second ferromagnetic layer. In another embodiment, the magnetic tunnel junction layer 100 includes a sequentially stacked layers of an anti-ferromagnetic layer, a first ferromagnetic layer, a ruthenium layer, a second ferromagnetic layer, a tunnel insulating layer, and a third ferromagnetic layer. In another embodiment, the magnetic tunnel junction layer 100 includes a sequentially stacked layers of a first ferromagnetic layer, a ruthenium layer, a second ferromagnetic layer, a tunnel insulating layer, and a third ferromagnetic layer. In above embodiments, the first to third ferromagnetic layer may include at least one of the above-mentioned ferromagnetic materials.

In the MTJ device according to exemplary embodiments of the present invention, even if the MTJ device has the same area per unit as the conventional MTJ device, ferromagnetic layers included in a magnetic tunnel junction layer have larger interfacial area than those of the conventional MTJ. Thus, the MTJ of the present invention may increase scalability of the MRAM device by increasing an interfacial area of ferromagnetic layers and preventing the MRAM device from having super-paramagnetic characteristic.

In accordance with exemplary embodiments of the present invention, because a size of single MTJ device may be reduced, the MRAM device including plural MTJ devices may be scaled down. Also, when the MTJ of the present invention may have the same size with those of the conventional MRAM, spin switching operation reliability of the MTJ device increases because its interfacial area is larger than those of the conventional MRAM. Particularly, because a curved MTJ device according to exemplary embodiments of the present invention may achieve high density compared to the conventional MTJ having a flattened and stacked structure, a spin-transfer torque random access memory (STT-RAM) may increase storage capacity. Also, using the MTJ device according to the present invention, stray field reducing total magnetic moment may be prevented from being generated by the magnetization in a magnet layer so that the STT-RAM has more operation reliability than the conventional MRAM using a magnetic field of MTJ device.

Figure 2:
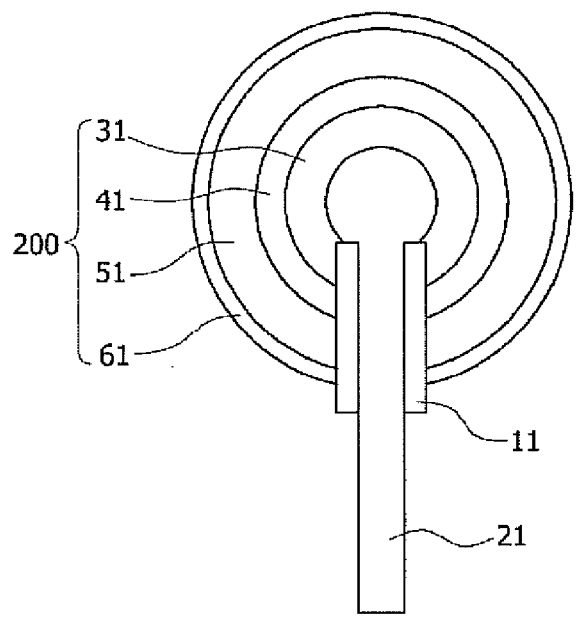
FIG. 2 is a cross-sectional view depicting a MTJ device in accordance with another exemplary embodiment of the present invention.

FIG. 2 is a cross-sectional view depicting a MTJ device in accordance with another exemplary embodiment of the present invention.

As shown, the MTJ includes a first electrode 21 having a spherical structure with a protruded pillar pattern, a magnetic tunnel junction layer 200 covering a spherical surface of the first electrode 21, an insulating layer 11 configured to insulate the magnetic tunnel junction layer 200 from the protruded pillar pattern of the first electrode 21, and a second electrode (not shown) arranged on the magnetic tunnel junction 200. The magnetic tunnel junction layer 200 includes a free layer 31 arranged on the first electrode 21, a tunnel insulating layer 41 arranged on the free layer 31, a pinned layer 51 arranged on the tunnel insulating layer 41, and a pinning layer 61 arranged on the pinned layer 51.

Further, in another exemplary embodiment, the magnetic tunnel junction layer 200 may have a stacked structure of a pinning layer, a pinned layer, a tunnel insulating layer, and a free layer, which are formed in order on the first electrode 21. The pinning layer 61, the pinned layer 51, and the free layer 31 may respectively include any material used in above-mentioned embodiment. The insulating layer 11 may also include any material used in above-mentioned embodiment.

According to exemplary embodiments, the second electrode may cover either a partial area of the pinning layer 61 or whole area of the pinning layer 61.

Figure 3:
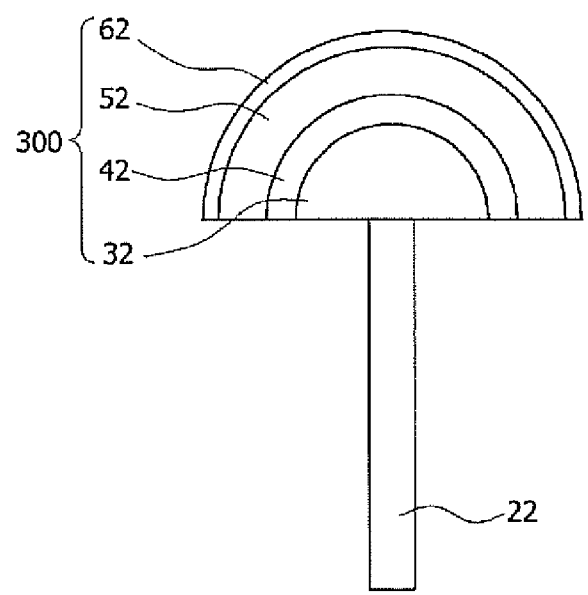
FIG. 3 is a cross-sectional view describing a MTJ device in accordance with another exemplary embodiment of the present invention.

FIG. 3 is a cross-sectional view describing a MTJ device in accordance with another embodiment of the present invention.

As shown, the MTJ device includes a first electrode 22 having a pillar structure, a magnetic tunnel junction layer 300 including a bottom surface connected to the first electrode 22 and a top bowed surface, and a second electrode (not shown) arranged on the magnetic tunnel junction 300. The magnetic tunnel junction layer 300 includes a free layer 32 arranged on the first electrode 22, a tunnel insulating layer 42 arranged on the free layer 32, a pinned layer 52 arranged on the tunnel insulating layer 42, and a pinning layer 62 arranged on the pinned layer 52.

Further, in another exemplary embodiment, the magnetic tunnel junction layer 300 may have a stacked structure of a pinning layer, a pinned layer, a tunnel insulating layer, and a free layer, which are formed in order on the first electrode 22. The pinning layer 62, the pinned layer 52, and the free layer 32 may respectively include any material used in above-mentioned embodiment.

Figure 4:
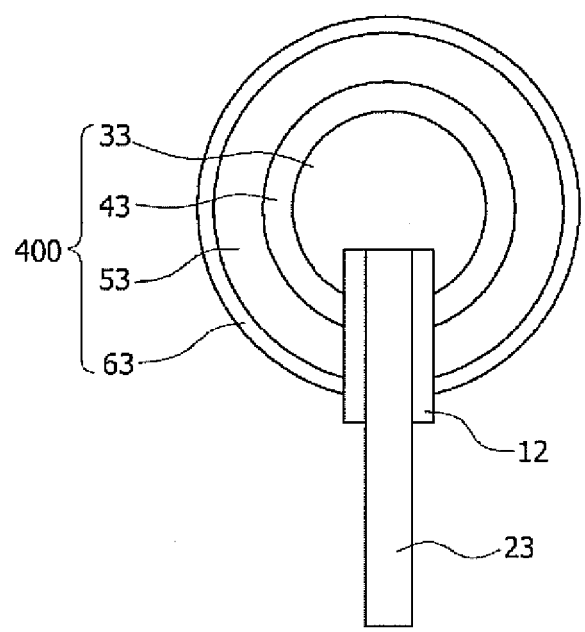
FIG. 4 is a cross-sectional view showing a MTJ device in accordance with another exemplary embodiment of the present invention.

FIG. 4 is a cross-sectional view showing a MTJ device in accordance with another exemplary embodiment of the present invention.

As shown, the MTJ device includes a first electrode 23 having a pillar structure, a magnetic tunnel junction layer 400 covering a set portion at an upper area of the first electrode 23, a second electrode (not shown) arranged on the magnetic tunnel junction, and an insulating layer 12 configured to electronically isolate the magnetic tunnel junction 400 from a side area of the first electrode 23.

The magnetic tunnel junction layer 400 includes a free layer 33 arranged on the first electrode 23, a tunnel insulating layer 43 arranged on the free layer 33, a pinned layer 53 arranged on the tunnel insulating layer 43, and a pinning layer 63 arranged on the pinned layer 53.

Further, in another exemplary embodiment, the magnetic tunnel junction layer 400 may have a stacked structure of a pinning layer, a pinned layer, a tunnel insulating layer, and a free layer, which are formed in order on the first electrode 23. The pinning layer 63, the pinned layer 53, and the free layer 33 may respectively include any material used in above-mentioned embodiment. The insulating layer 12 may also include any material used in above-mentioned embodiment.

According to exemplary embodiments, the second electrode may cover either a partial area of the pinning layer 63 or whole area of the pinning layer 63.

Figure 5A:
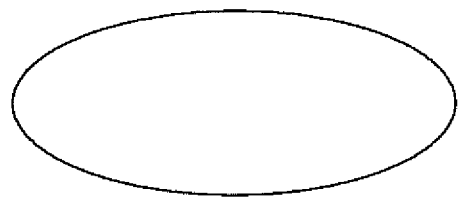
FIGS. 5A to 5C are plane views depicting a magnetic tunnel junction layer included in the MTJ devices shown in FIGS. 1 to 4.
Figure 5B:
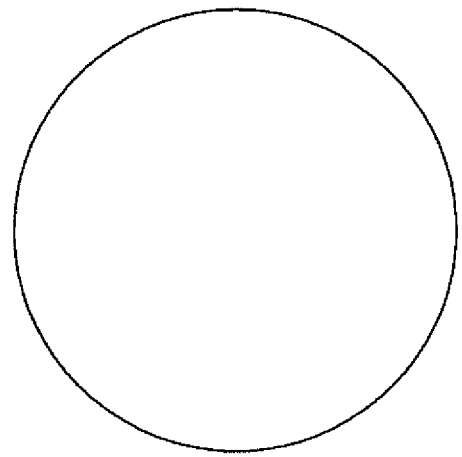
Figure 5C:
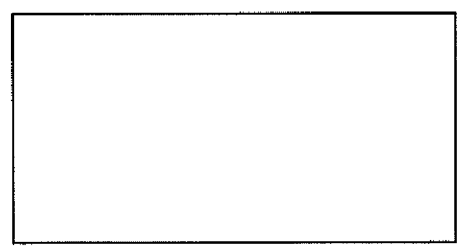

FIGS. 5A to 5C are plan views depicting a magnetic tunnel junction layer included in the MTJ devices shown in FIGS. 1 to 4.

As shown, in plan views, the magnetic tunnel junction layer has a form of one selected from the group of oval, circle, and rectangular.

Figure 6:
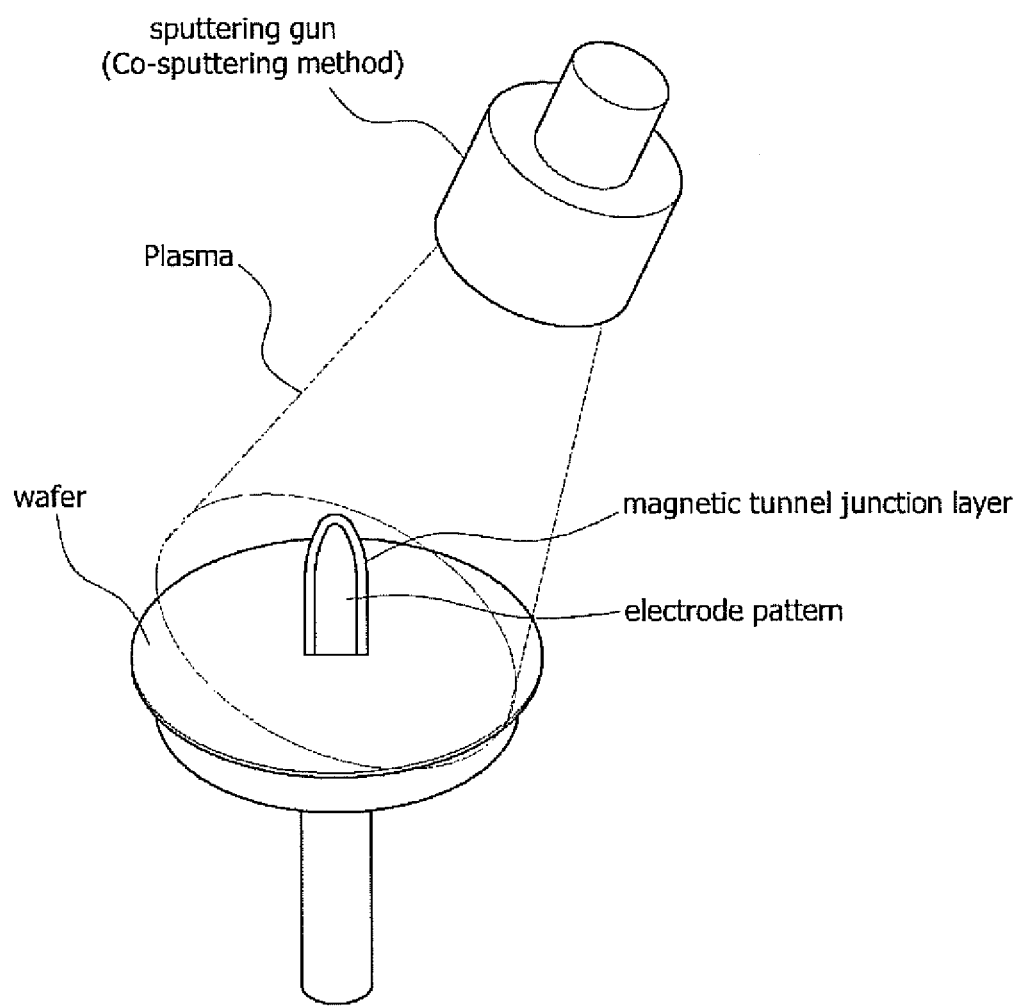
FIG. 6 is a perspective view describing a process used for fabricating the MTJ devices shown in FIGS. 1 to 4.

FIG. 6 is a perspective view describing a process for fabricating the MTJ devices shown in FIGS. 1 to 4.

As shown, for fabricating an electrode of the MTJ devices, a co-sputtering process is performed because it has an advantage of step coverage. In the co-sputtering process, only wafer may be rotated, or a wafer and an axis of wafer holder may be rotated and revolved respectively. The co-sputtering process may apply to fabrication of other layers included in the MTJ device.

FIGS. 7A to 7F depict a method for forming the MTJ devices shown in FIGS. 1 to 4.

In the method for fabricating a magnetic tunnel junction device, there is forming a first electrode. The first electrode has a different shape according to fabrication methods in embodiments of the present invention. Then, a magnetic tunnel junction layer is formed on the first electrode, and a second electrode is formed on the magnetic tunnel junction layer.

Figure 7A:
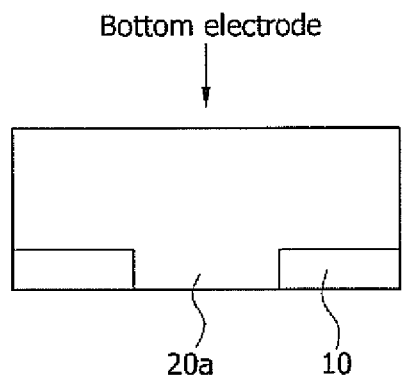
FIGS. 7A to 7F depict a method for forming the MTJ devices shown in FIGS. 1 to 4.

Referring to FIG. 7A, an insulation layer 10 with patterns is formed on a substrate. For gap-fill of the patterns, a first electrode conducting layer 20a is formed on the insulating layer 10.

Figure 7B:
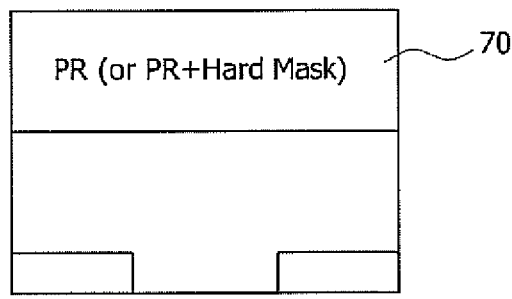

Referring to FIG. 7B, a sacrificial layer 70 is formed on a first electrode conducting layer 20a.

Figure 7C:
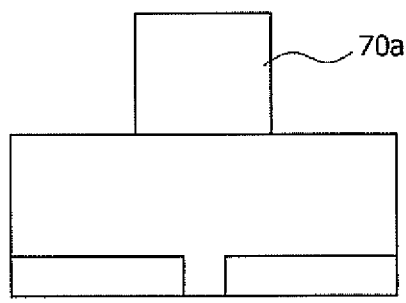

Referring to FIG. 7C, the sacrificial layer 70 is patterned to form a sacrificial pattern 70a. The sacrificial layer 70 may includes a photo-resist layer, a hard mask layer, or a combination of the photo-resist layer and the hard mask layer.

Figure 7D:
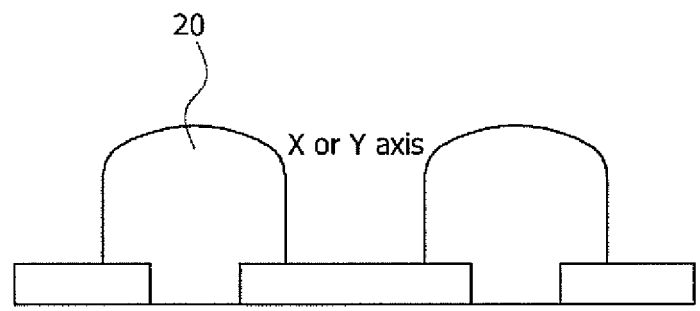
Figure 7D:
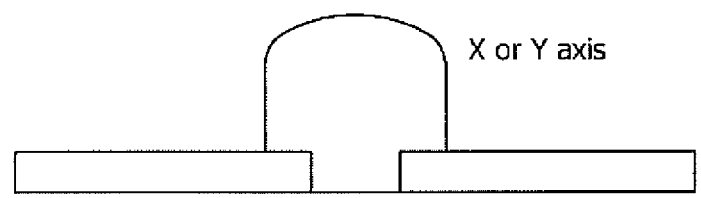

Referring to FIG. 7D, using the sacrificial pattern 70a as an etch mask, the first electrode conducting layer 20a is etched to form a first electrode 20 having a bowed top surface.

Figure 7E:
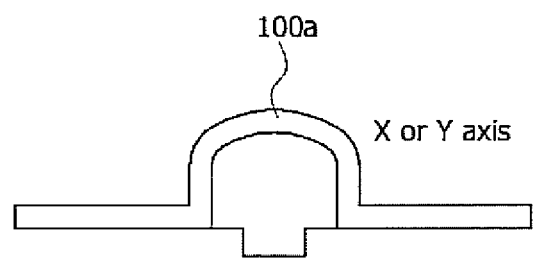
Figure 7E:
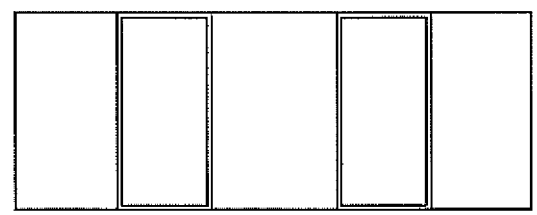

Referring to FIG. 7E, a junction layer 100a is formed on the first electrode 20.

Figure 7F:
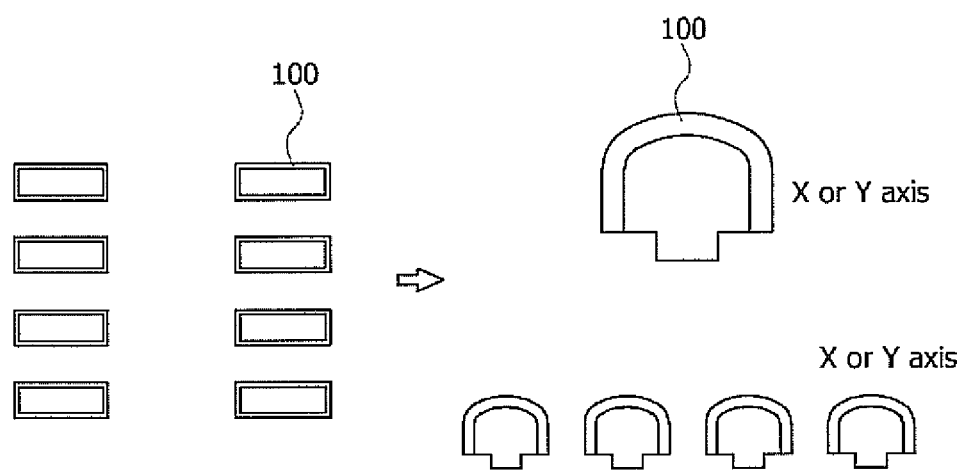

Referring to FIG. 7F, the junction layer 100a is patterned to form a magnetic tunnel junction layer 100.

As discussed above, according to exemplary embodiments of the present invention, a magnetic tunnel junction (MTJ) is curved or bowed like a dome or convex shape to facilitate securing an area of ferromagnetic layer in scaled-down MTJ device.

As applying to a STT-RAM or an MRAM, the MTJ devices according to exemplary embodiments may settle super paramagnetic characteristic appeared in conventional MTJ of scaled-down devices due to limited area of ferromagnetic layer. In an MRAM including the MTJ device according to embodiments, high density current for controlling a magnetization spin direction of the MTJ device may by no longer applied so that current consumption of the MRAM may be reduced.

In accordance with embodiments of the present invention, a spin-transfer torque random access memory or a magnetic random access memory with high integration and high operation reliability may be fabricated.

While the present invention has been described with respect to the specific embodiments, it will be apparent to those skilled in the art that various changes and modifications may be made without departing from the spirit and scope of the invention as defined in the following claims.

What is claimed is:

1. A magnetic tunnel junction device, comprising:
a first electrode having a curved top surface;
a magnetic tunnel junction layer formed along the top surface of the first electrode; and
a second electrode formed on the magnetic tunnel junction, wherein the magnetic tunnel junction layer includes:
a free layer arranged on the top surface of the first electrode;
a tunnel insulating layer arranged on a top surface of the free layer;
a pinned layer arranged on a top surface of the tunnel insulating layer; and
a pinning layer arranged on a top surface of the pinned layer.

2. The magnetic tunnel junction device as recited in claim 1, wherein the magnetic tunnel junction layer has a cross section in a form of one selected from the group of oval, circle, and rectangular.

3. The magnetic tunnel junction device as recited in claim 1, wherein the first electrode has one of a convex shaped structure and a dome shaped structure.

4. The magnetic tunnel junction device as recited in claim 1, wherein a bottom part of the first electrode includes a protrusion having a cylinder shape.

5. The magnetic tunnel junction device as recited in claim 1, wherein a top surface of the second electrode is flat by planarization.

6. A magnetic tunnel junction device, comprising:
a first electrode having a curved top surface;
a magnetic tunnel junction layer formed along the top surface of the first electrode; and
a second electrode formed on the magnetic tunnel junction, wherein the magnetic tunnel junction layer includes:
an anti-ferromagnetic layer arranged on the first electrode;
a first ferromagnetic layer arranged on the anti-ferromagnetic layer;
a ruthenium layer arranged on the first ferromagnetic layer;
a second ferromagnetic layer arranged on the ruthenium layer;
a tunnel insulating layer arranged on the second ferromagnetic layer; and
a third ferromagnetic layer arranged on the tunnel insulating layer.

7. A magnetic tunnel junction device, comprising:
a first electrode having a curved top surface;
a magnetic tunnel junction layer formed along the top surface of the first electrode; and
a second electrode formed on the magnetic tunnel junction, wherein the magnetic tunnel junction layer includes:
a first ferromagnetic layer arranged on the first electrode;
a ruthenium layer arranged on the first ferromagnetic layer;
a second ferromagnetic layer arranged on the ruthenium layer;
a tunnel insulating layer arranged on the second ferromagnetic layer; and
a third ferromagnetic layer arranged on the tunnel insulating layer.

* * * * *